United States Patent
He et al.

(10) Patent No.: US 8,902,945 B1
(45) Date of Patent: Dec. 2, 2014

(54) SEMICONDUCTOR LASER GAIN DEVICE WITH MODE FILTER

(75) Inventors: Xiaoguang He, Diamond Bar, CA (US); Martin Kwakernaak, Los Angeles, CA (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 13/567,307

(22) Filed: Aug. 6, 2012

(51) Int. Cl.
*H01S 5/00* (2006.01)

(52) U.S. Cl.
USPC .................................................. 372/45.01

(58) Field of Classification Search
USPC .................................................. 372/45.01
See application file for complete search history.

(56) References Cited

U.S. PATENT DOCUMENTS

| 6,052,222 A * | 4/2000 | Kitamura ..................... 359/344 |
| 6,118,802 A * | 9/2000 | Sanders et al. ............... 372/50.1 |
| 2008/0137180 A1 * | 6/2008 | Oh et al. ........................ 359/344 |
| 2008/0273564 A1 * | 11/2008 | Wang et al. .............. 372/45.011 |

* cited by examiner

*Primary Examiner* — Yuanda Zhang

(57) ABSTRACT

A semiconductor gain device comprising a substrate; an optical waveguide layer extending from a first end of the substrate to a second end of the substrate opposite to the first end, the optical waveguide layer including an active layer formed on the upper surface; a reflective mirror provided at one end of the optical waveguide layer, and an exit aperture on the other end of the optical waveguide layer for emitting optical energy; wherein at least a portion of the optical waveguide layer is curved on the surface of the substrate from the first end to the second end with a radius of curvature of less than 4 mm.

20 Claims, 10 Drawing Sheets

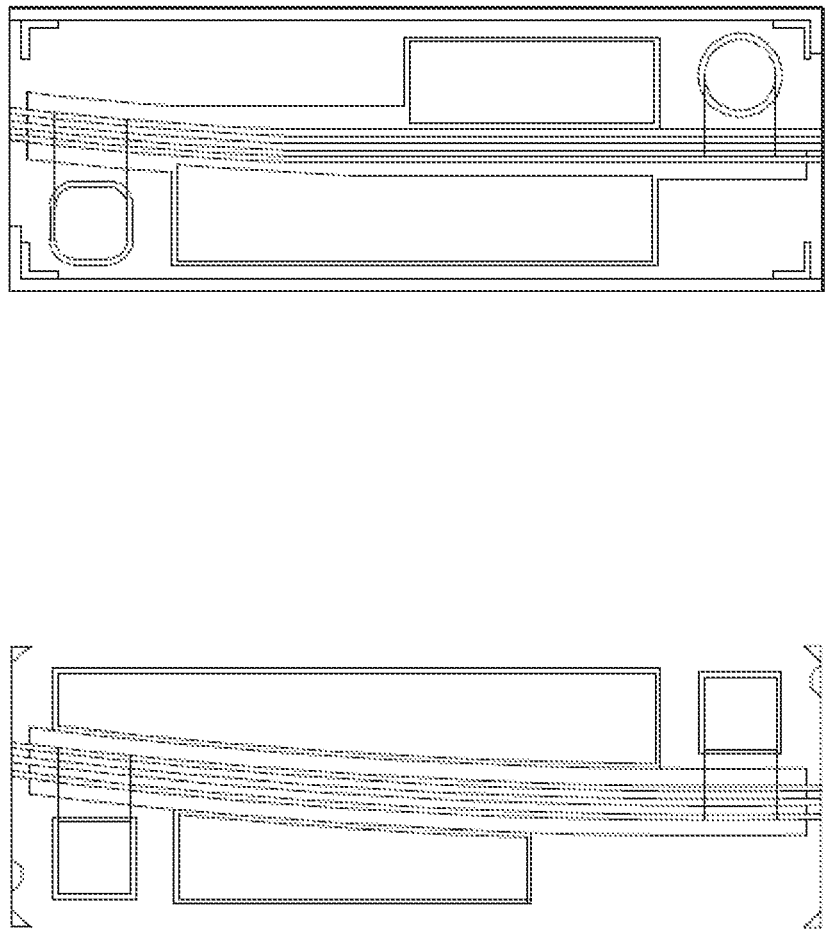

SEMICONDUCTOR LASER GAIN DEVICE WITH MODE FILTER

BACKGROUND OF THE INVENTION

1. Field of the Invention

The present invention relates to lasers and, in particular, to tunable external cavity diode lasers.

2. Discussion of Related Art

An optical telecommunication system transmits information from one place to another by way of an optical carrier whose frequency typically is in the visible or near-infrared region of the electromagnetic spectrum. A carrier with such a high frequency is sometimes referred to as an optical signal, an optical carrier, light beam, or a lightwave signal. The optical telecommunication system includes several optical fibers and each optical fiber includes multiple channels. A channel is a specified frequency band of an electromagnetic signal, and is sometimes referred to as a wavelength. The purpose for using multiple channels in the same optical fiber (called dense wavelength division multiplexing (DWDM)) is to take advantage of the unprecedented capacity (i.e., bandwidth) offered by optical fibers. Essentially, each channel has its own wavelength, and all wavelengths are separated enough to prevent overlap. The International Telecommunications Union (ITU) currently determines the channel separations.

One link of an optical telecommunication system typically has a transmitter, the optical fiber, and a receiver. The transmitter has a laser, which converts an electrical signal into the optical signal and launches it into the optical fiber. The optical fiber transports the optical signal to the receiver. The receiver converts the optical signal back into an electrical signal.

External cavity diode lasers (ECDL) are attracting increasing attention with optical telecommunication system builders as potential widely tunable light sources. A typical ECDL includes a diode laser gain medium (i.e. a gain "chip" or semiconductor device) with an antireflection-coated facet on one end and a reflective or partially reflective facet on the other end, an end mirror, and a wavelength selection element (optical filter). The end mirror and reflective facet form an external laser cavity. The parameters of the gain medium are usually chosen to maximize the output power of the ECDL. The output power of the ECDL is maximized by, among other things, increasing the gain of the gain medium.

Laser resonators such as a gain medium have two distinct types of modes: transverse and longitudinal. Transverse modes manifest themselves in the cross-sectional intensity profile of the laser beam within the waveguide. Longitudinal modes correspond to different resonances along the length of the laser cavity which occur at different wavelengths within the gain bandwidth of the laser. Mode hopping occurs when relative intensities at different lines corresponding to different longitudinal modes shift under certain circumstances. In order to provide a reliable communications link utilizing an optical transmitter, it is desired to prevent mode hopping in lasers used in such optical communications applications.

A factor in whether mode hopping will tend to occur in a laser is the degree of stability of the laser. There are many forms of stability, including wavelength stability, pulse-to-pulse energy stability, repetition rate stability, thermal stability, bandwidth stability, among others, and these may be attempted to be controlled in various ways. For example, energy stability and repetition rate stability often depend on the stability of the electrical or optical energy input to the gain medium. The degree of wavelength or bandwidth stability may depend on quality of resonator materials and other factors. The degree of thermal stability may influence the wavelength or bandwidth stability, and may typically depend on the heat capacity of the gain medium and whether cooling and/or heating elements are provided along with a thermal sensor, i.e., a temperature controller, heat exchanger or other such thermal monitor and heat transport device, and what degree of sensitivity of thermal control these devices exhibit. Various developments have been made for stabilizing various parameters of laser systems including operating temperature, and preventing occurrences of mode hopping.

One characteristic of increasing gain medium gain to maximize ECDL output power is that the ECDL may become unstable in single mode and begin multimode lasing. This means that the ECDL begins lasing at different frequencies simultaneously or hops between several frequencies. Multimode lasing is acceptable in some applications, such as when the gain medium is used as a pump laser. However, when the gain medium is used in an application such as a tunable ECDL in an optical communication system such instability may be unacceptable. Customer specifications and telecommunications standards require that the diode laser must operate within a very tight range of frequencies and cannot hop from frequency to frequency.

SUMMARY OF THE INVENTION

1. Objects of the Invention

It is an object of the present invention to provide an improved gain medium for an external cavity laser.

It is another object of the present invention to provide a gain medium for an external cavity laser which is wide enough to support multimodes, yet emits only a single mode from its exit aperture.

2. Features of the Invention

Briefly, and in general terms, the present disclosure provides a semiconductor gain device comprising a substrate; an optical waveguide layer extending from a first end of the substrate to a second end of the substrate opposite to the first end, the optical waveguide layer including an active layer formed on the upper surface; a reflective mirror provided at one end of the optical waveguide layer, and an exit aperture on the other end of the optical waveguide layer for emitting optical energy; wherein at least a portion of the optical waveguide layer is curved on the surface of the substrate from the first end to the second end with a radius of curvature of less than 4 mm.

In some embodiments, the distance from the first end to the second end is 2.0 mm or less.

In some embodiments, the distance from the first end to the second end is 1.0 mm.

In some embodiment, the optical waveguide layer includes a first portion with zero curvature, and a second portion with a radius of curvature of less than 4 mm.

In some embodiments, the optical waveguide layer includes a first portion with zero curvature, and a second portion adjacent to the first portion with an increasing radius of curvature, and a third portion adjacent to the second portion with a radius of curvature of less than 4 mm.

In some embodiments, the optical waveguide layer includes a fourth portion adjacent to the third portion with a decreasing radius of curvature.

In some embodiments, the first portion of the optical waveguide layer is 0.4 mm or less in length.

In some embodiments, the third portion of the optical waveguide layer is at least 0.2 mm or more in length.

In some embodiments, the second portion of the optical waveguide layer is at least 0.2 mm or more in length.

In some embodiments, the fourth portion of the optical waveguide layer is at least 0.2 mm or more in length.

In another aspect the present disclosure provides a small, packaged tunable laser comprising a rectangular housing having a volume of less than 0.6 cubic centimeters, with six planar exterior walls including a bottom, a top, opposing first and second ends, and opposing sidewalls, the exterior walls forming a hermetically sealed interior space that includes a major axis that extends through the first and second ends; an electrical input interface positioned on the exterior of the housing; an optical output interface positioned on the exterior of the housing and aligned with the major axis, the optical output interface configured to transmit a continuous wave optical beam; and a tunable semiconductor laser positioned in the interior space and operable to emit a laser beam having a selectable wavelength, including a semiconductor gain device comprising a substrate; an optical waveguide layer extending from a first end of the substrate to a second end of the substrate opposite to the first end, the optical waveguide layer including an active layer formed on the upper surface; a reflective mirror provided at one end of the optical waveguide layer, and an exit aperture on the other end of the optical waveguide layer for emitting optical energy; wherein at least a portion of the optical waveguide layer is curved on the surface of the substrate from the first end to the second end with a radius of curvature of less than 4 mm.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

The invention will be better and more fully appreciated by reference to the following detailed description when considered in conjunction with the accompanying drawings, wherein:

FIG. 6A is an enlarged top planar view of an external cavity laser gain medium semiconductor device known in the prior art, and FIG. 6B is an enlarged top planar view of an external cavity laser gain medium semiconductor device according to the present disclosure;

DESCRIPTION OF THE PREFERRED EMBODIMENT

Figure 1:
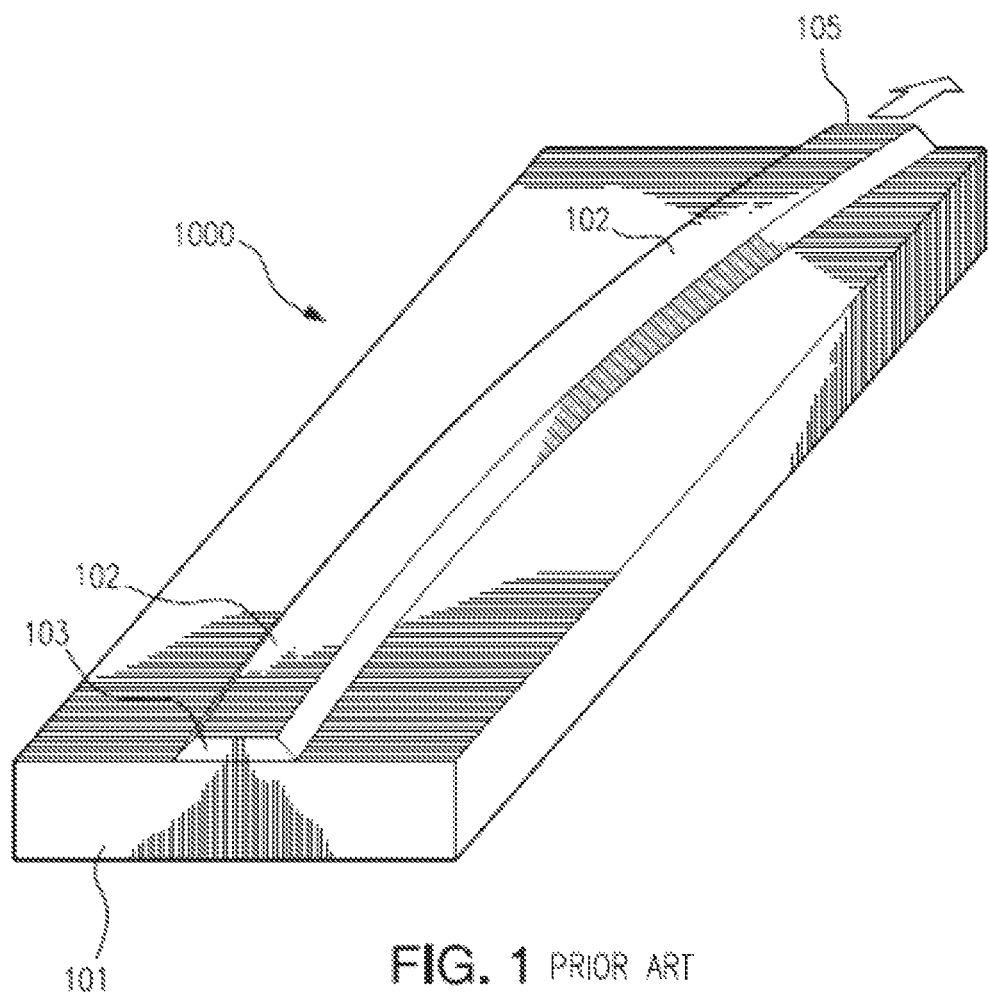
FIG. 1 is a perspective view of an external cavity laser gain medium semiconductor device according to the present disclosure.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a perspective view of an external cavity laser gain medium semiconductor device according to the prior art. There is depicted a body 1000 including an elongated semiconductor substrate 101 with a waveguide layer 102 that extends from one edge 103 of the semiconductor substrate 101 to the other edge 105. The waveguide layer 102 has constant curvature along its length, and terminates in an edge 105 from which the optical energy is emitted.

Figure 2:
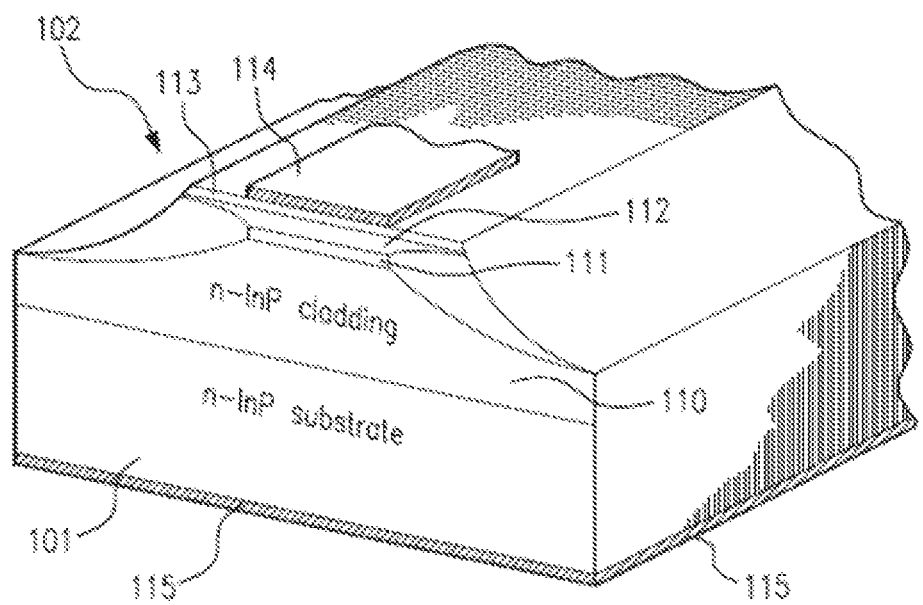
FIG. 2 is an enlarged cross-sectional perspective view of the external cavity laser gain medium semiconductor device of FIG. 1.

FIG. 2 is an enlarged cross-sectional perspective view of the external cavity laser gain medium semiconductor device 100 of FIG. 1. The device 100 includes a substrate layer 101, a bottom cladding layer 110, each composed of be n-type doped InP, an active layer 111, and a top cladding layer 112. On top of the top cladding layer 203 is a contact layer 113 composed of InGaAs, and over the contact layer 113 is a metal electrode layer 114. The bottom surface of the substrate layer 101 is covered with a metal electrode layer 115.

Figure 3:
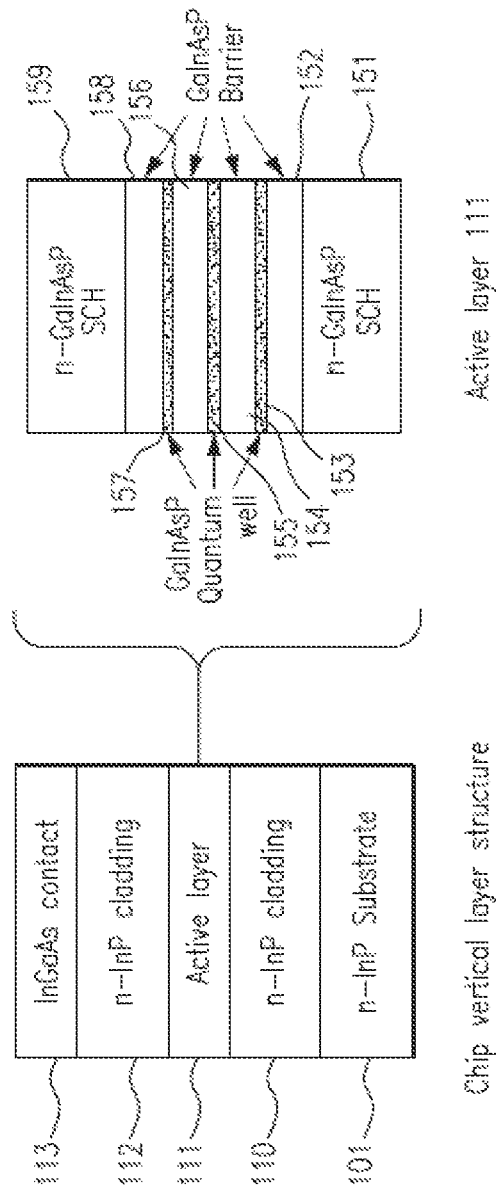
FIG. 3 is an enlarged vertical view of the cross-section of the external cavity laser gain medium semiconductor device of FIG. 2.

FIG. 3 is an enlarged vertical view of the cross-section of the external cavity laser gain medium semiconductor device 1000 of FIG. 2. The left hand portion of the Figure depicts the sequence of layers described in FIG. 2, and the right hand portion depicts the structure of the active layer 111.

In the depicted embodiment, the active layer 111 has quantum well layers 153, 155, and 157, and barrier layers 152, 154, 156 and 158. The barrier layers 152, 154, 156 and 158 may be n- or p-doped GaInAsP layers. The quantum well layers 153, 155, and 157 may be GaInAsP layers. After reading the description herein, a person of ordinary skill will readily recognize how to fabricate gain media using various materials according to embodiments of the present disclosure. One such fabrication technique includes well-known metalorganic chemical vapor deposition (MOCVD) growth techniques.

There may be one or more in the barrier layers 152, 154, 156 and 158. In one embodiment of the present invention, the bather layers 152, 154, 156 and 158 may be doped with an n-type dopant, such as sulfur (S), selenium (Se), tellurium (Te), or other suitable dopant to control (e.g., reduce) the transparency current of the gain medium 1000. After reading the description herein, a person of ordinary skill will readily recognize how to dope the barrier layers 152, 154, 156 and 158 to control the transparency current for various embodiments of the present disclosure.

There is a crystalline lattice mismatch between the material in the quantum well layer 157 and the material in the barrier layer 158, and a crystalline lattice mismatch between the material in the quantum well layer 155 and the material in the barrier layer 156 (also called strained quantum wells or strained layer structures). Likewise, there is a crystalline lattice mismatch between the material in the quantum well layer 157 and the material in the barrier layer 156 and a crystalline lattice mismatch between the material in the quantum well layer 155 and the material in the bather layer 154. In one embodiment of the present invention, the crystalline lattice mismatch between the material in the quantum well layers 153, 155, and 157, and the material in the bather layers 152, 154, 156 and 158 is controlled (e.g., increased) to reduce transparency current.

Figure 4:
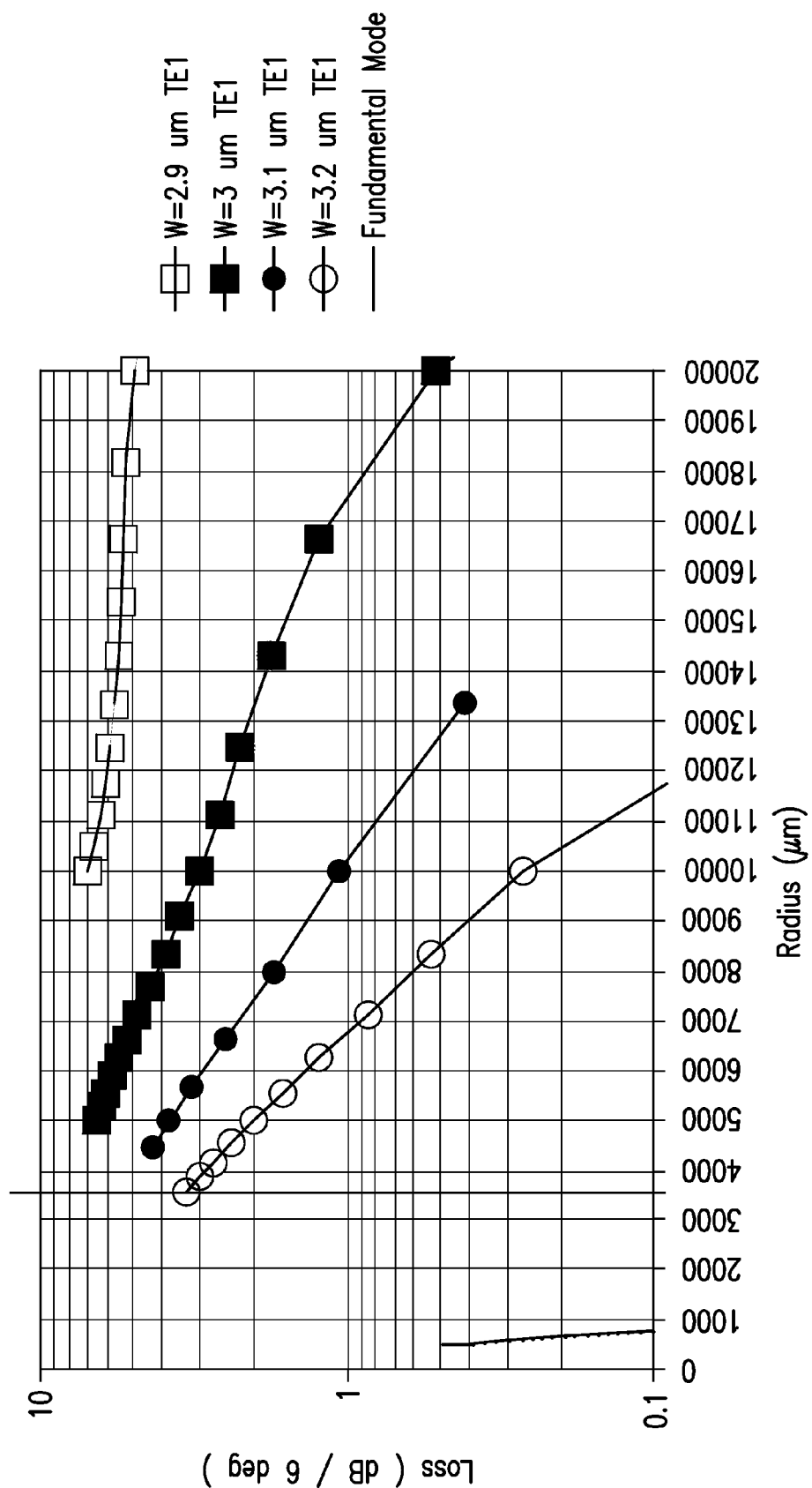
FIG. 4 is a graph depicting the simulation results of the performance of various structures for an external cavity laser gain medium.

FIG. 4 is a graph depicting the simulation results of the performance of various structures for an external cavity laser gain medium. The curves depict the loss for various width waveguides measured in dB for a bending radius of one 6 degree turn. The width (W) of the various depicted waveguide examples is shown on the table on the right side of the Figure, together with the mode being propagated in the cavity (TE1). The graph depicts the simulation results of the performance of the cavity measured as a function of loss plotted against the radius of the waveguide, ranging from 0 to 20000 microns. In the embodiment of the present disclosure, the radius is selected as 3.8 mm.

Figure 5A:
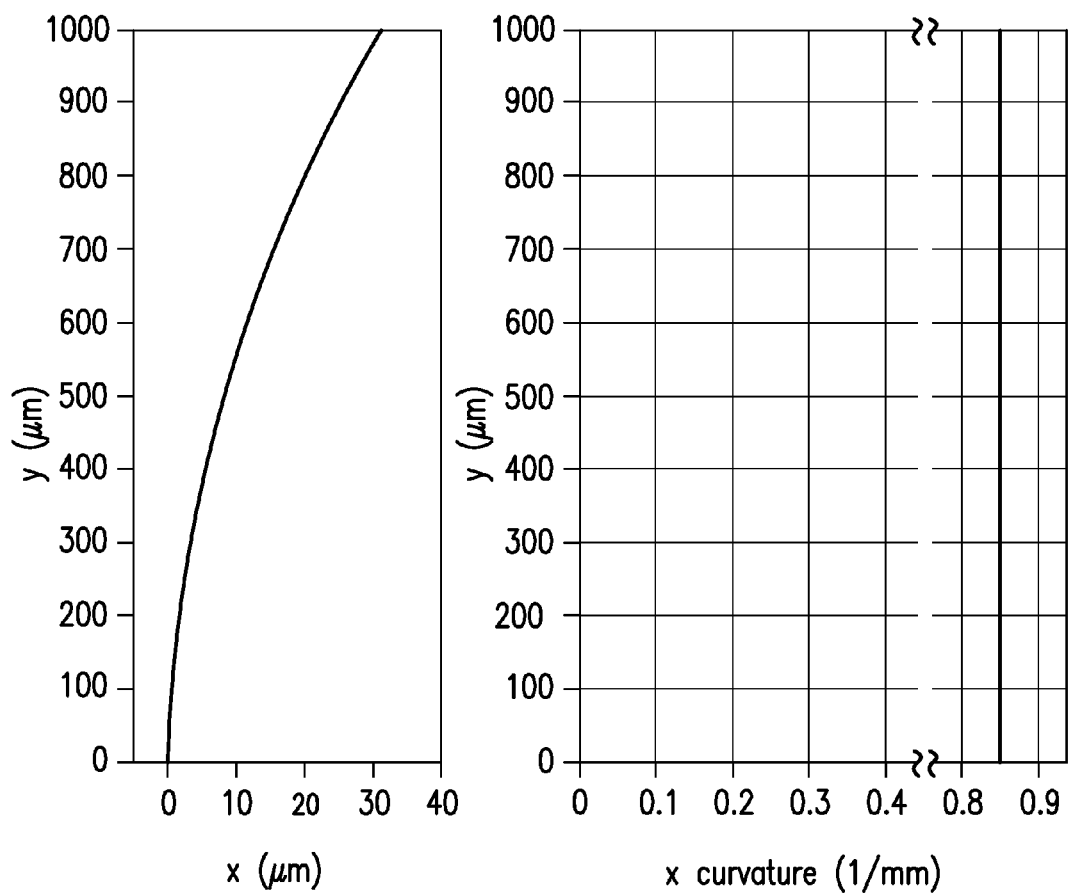
FIG. 5A is an enlarged top planar view of the external cavity laser gain medium semiconductor device of FIG. 1 as is known in the prior art, and a graph defining the curvature of the medium along the substrate.

FIG. 5A is an enlarged top planar view of the external cavity laser gain medium semiconductor device of FIG. 1 as is known in the prior art, and on the right side of the Figure, a graph defining the curvature of the medium along the substrate. In this example, the curvature is constant over the length at a value of 0.86 (1/mm).

Figure 5B:
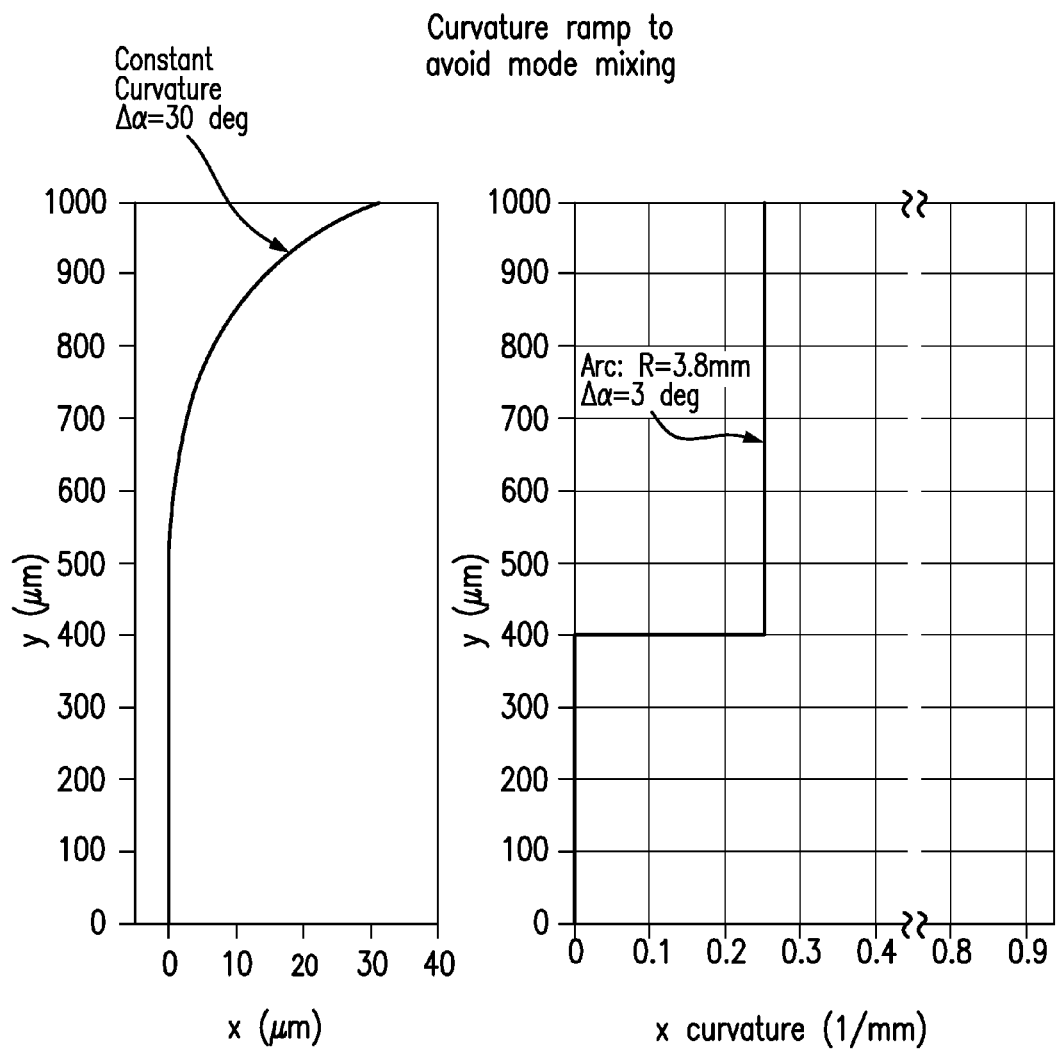
FIG. 5B is an enlarged top planar view of the external cavity laser gain medium semiconductor device in a first embodiment, and a graph defining the curvature of the medium along the substrate.

FIG. 5B is an enlarged top planar view of the external cavity laser gain medium semiconductor device in a first embodiment, and on the right side of the Figure, a graph defining the curvature of the medium along the substrate. In this example, the curvature is constant at 0 (i.e., a straight line) from 0 to 400 mm along the length of the device, then constant at 0.26/mm (corresponding to a radius of curvature of 3.8 mm) from 400 to 1000 mm along the remaining length of the device. In some embodiments, the distance from the first end to the second end is 2.0 mm or less. In some embodiments, the distance from the first end to the second end is 1.0 mm.

Figure 5C:
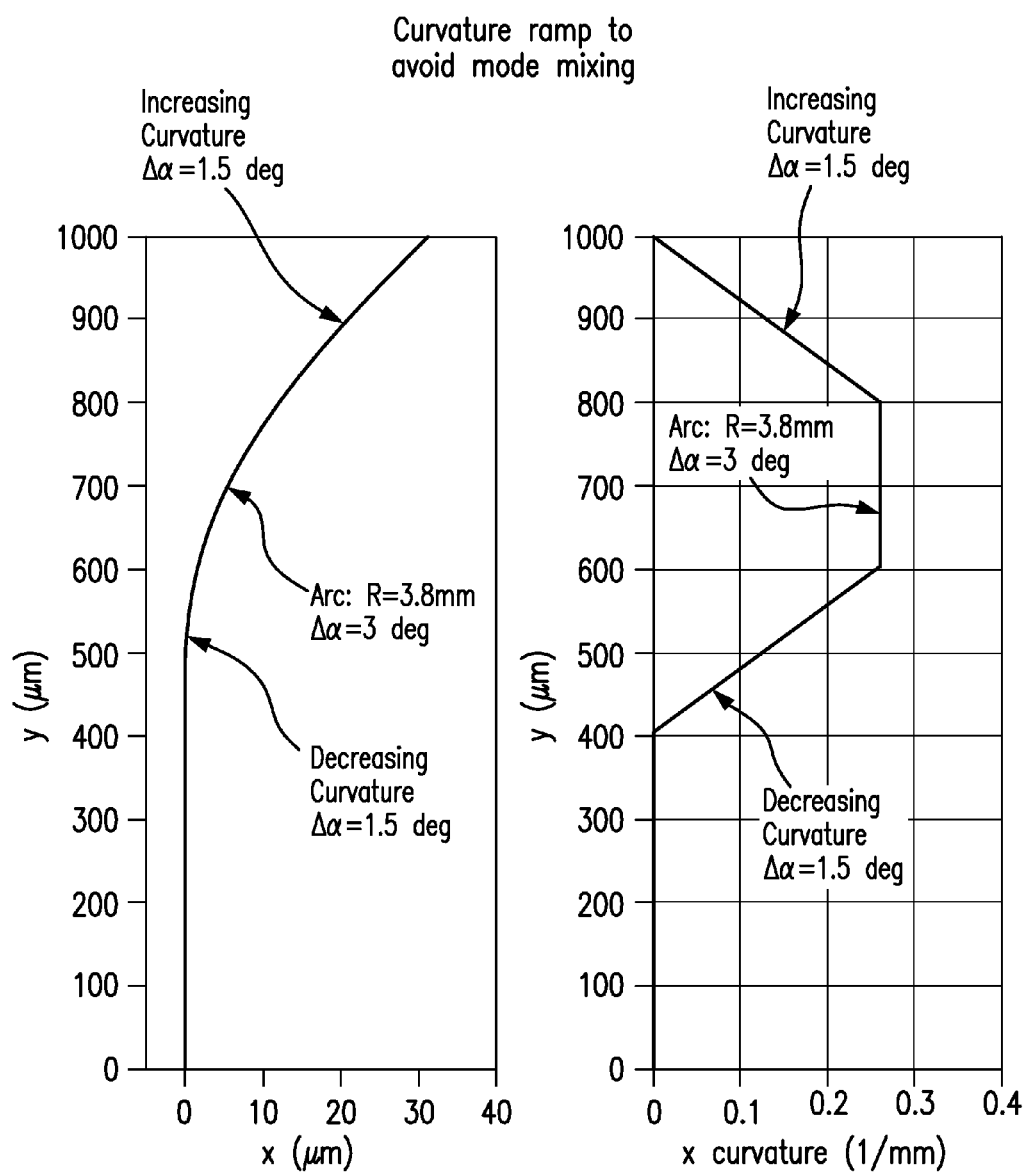
FIG. 5C is an enlarged top planar view of the external cavity laser gain medium semiconductor device in a second embodiment, and a graph defining the curvature of the medium along the substrate.

FIG. 5C is an enlarged top planar view of the external cavity laser gain medium semiconductor device in a second embodiment, and on the right side of the Figure, a graph defining the curvature of the medium along the substrate. In this example, the curvature is constant at 0 (i.e., a straight line) from 0 to 400 mm along the length of the device, then decreasing from 400 to 600 mm from 0 to 0.26/mm (corresponding to a radius of curvature of 3.8 mm), then constant at 0.26/mm from 600 to 800 mm along the length of the device, then increasing from 800 to 1000 mm from 0.26/mm to 0 along the remaining length of the device.

FIG. 6A is an enlarged top planar view of an external cavity laser gain medium semiconductor device known in the prior art with a curvature of 1/8.6 mm.

FIG. 6B is an enlarged top planar view of an external cavity laser gain medium semiconductor device according to the present disclosure with a curvature of 1/3.8 mm.

Figure 7:
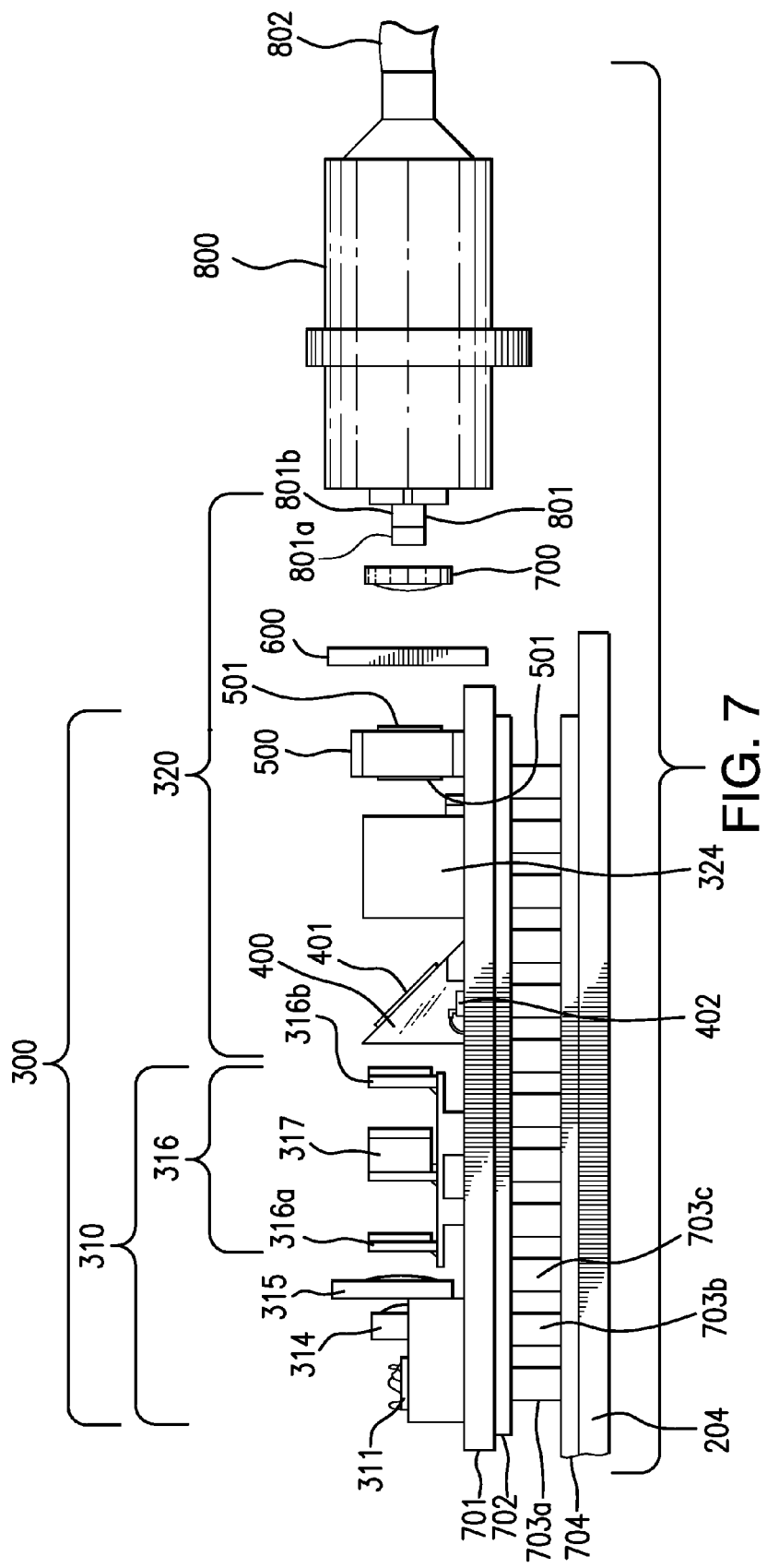
FIG. 7 is a top perspective view of a small, packaged tunable laser including the external cavity laser gain medium semiconductor device according to the present disclosure.

FIG. 7 is a top perspective view of a small, packaged tunable laser including the external cavity laser gain medium semiconductor device according to the present disclosure;

As an example of an implementation of the external cavity laser gain medium semiconductor device according to the present disclosure, FIG. 7 depicts a tunable laser 100 as packaged in a housing 200 that forms an interior space for housing the laser components 300. The laser 100 includes an overall small size for use in optical transceivers and various other applications.

The housing 200 includes a generally rectangular body 206 with exterior walls that forms a substantially rectangular shape. The body 206 includes a bottom 204, a cover (not illustrated), first and second ends 230, 231, and opposing sidewalls 232, 233. The cover may be substantially planar and positioned on the top surfaces of the first and second ends 230, 231 and opposing sidewalls 232, 233. In one embodiment, the cover is substantially identical to the bottom 204.

The housing 200 includes a substantially rectangular shape with a width W formed by the opposing sidewalls 232, 233, a length L formed by the first and second ends 230, 231, and a height H that extends between the bottom 204 and top of the sidewalls 232, 233 and ends 230, 231. The housing 200 may include various sizes. In one specific embodiment, the width W is about 5.4 mm, the length L is about 17.1 mm, and the height H is about 5.9 mm. The volume of the interior space formed by the housing 200 may also vary depending upon the application. Exemplary volumes may range from between about 400 mm$^3$ to about 600 mm$^3$. In one specific embodiment, the volume is about 545 mm$^3$. The housing 200 includes an elongated shape with a major axis X extending along the length L through the first and second ends 230, 231, and a minor axis Y perpendicular to the major axis and extending through the opposing sidewalls 232, 233. The housing 200 may be hermetically sealed to protect the transmitter components 300 from humidity and other environmental conditions.

An electrical input interface 202 extends outward from the first end 230 of the housing 200. The electrical interface 202 is configured to receive power and electrical control signals for adjusting parameters of the laser, including its output frequency. In the embodiment depicted in FIG. 7, the electrical interface 202 includes a flexible cable 213 that is aligned with the major axis X, and includes various connections. The electrical interface 202 may also include additional flexible cables 213 that extend outward from the first end 230, or sidewalls 232, 233. In other embodiments, fixed electrical pins or connectors may be used as an electrical interface.

An optical output interface 201 extends outward from the second end 231 of the housing 200. In one embodiment, the optical output interface 201 is aligned with the major axis X of the housing 200. The optical output interface 201 is configured to transmit an optical beam that is emitted from the transmitter components 300.

Figure 8:
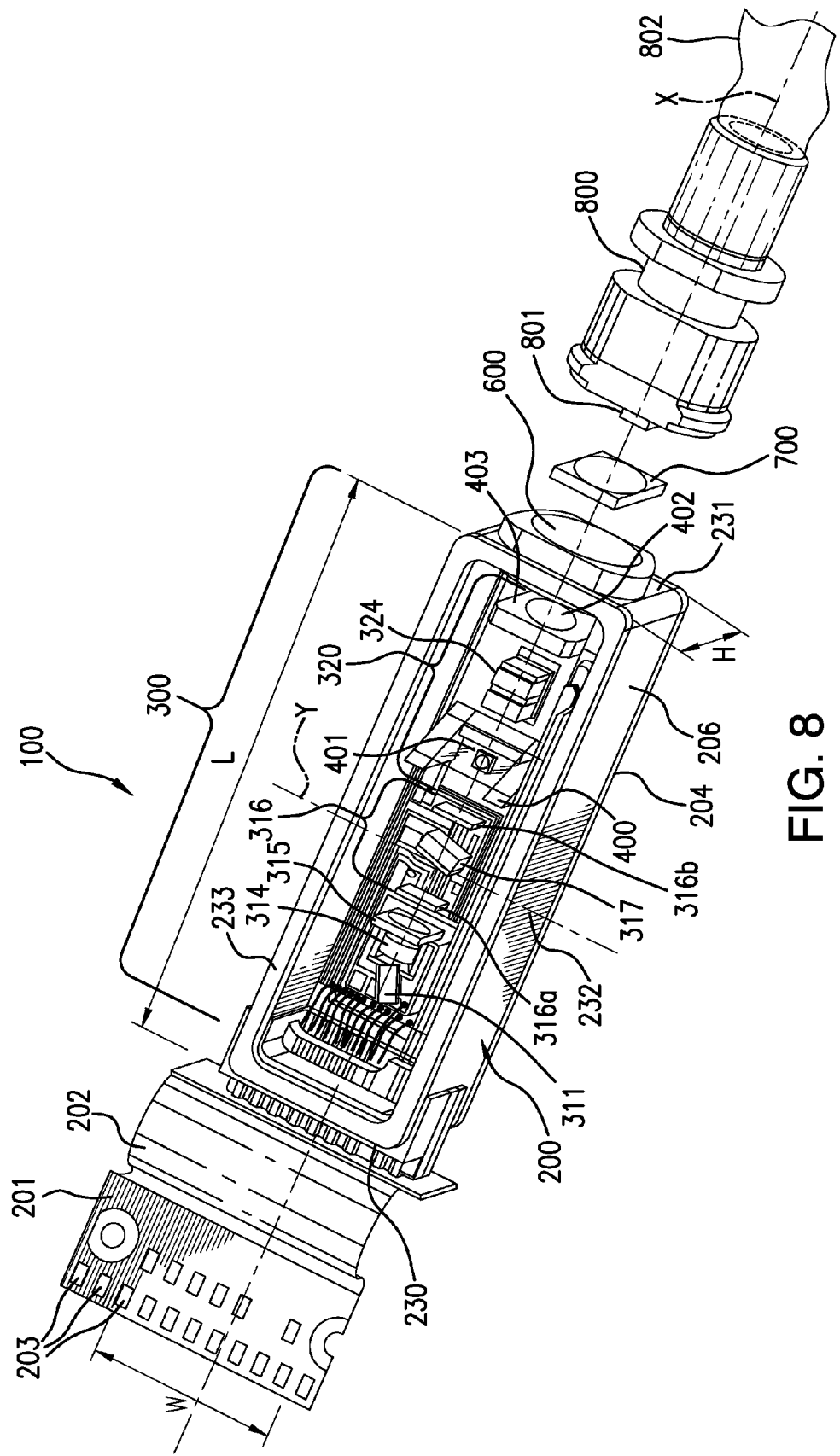
FIG. 8 is a side elevational view of the interior components in the tunable laser of FIG. 7.

The laser components 300 generally include an external cavity laser 310, coupling optics 320. FIG. 8 schematically illustrates the components 300 according to one embodiment.

The external cavity laser 310 includes a diode gain chip 311 comprising a Fabry-Perot diode laser with a substantially non-reflective front facet 312 and a highly reflective rear facet 313. The rear facet or end mirror 313 and reflective facet 312 of the gain medium define the laser cavity. The gain chip 311 may also include a bent-waveguide structure. The external cavity laser 310 also includes a collimating lens 314, a steering lens 315, a tunable filter 316, a cavity length actuator 317, and a reflective element 319. Possible implementations of the tunable filter 316 include but are not limited to Bragg gratings, Fabry-Perot etalons, and liquid crystal waveguides. The actuator 317 may use thermal, mechanical, or electro-optical mechanisms to adjust the optical pathlength of the laser cavity. The actuator 317 may also lock the optical pathlength.

The external cavity tunable laser 310 may be configured with the tunable filter 316 being decoupled from the gain chip 311. This configuration results in the tunable filter 316 being very stable and therefore does not require an external wavelength locker as required in Distributed Feedback (DFB) lasers and Distributed Bragg Reflector (DBR) lasers. Other advantages of the external cavity tunable laser 310 over these other lasers are the extremely narrow linewidth and very high side mode suppression ratio.

The coupling optics 320 includes a wedge shaped support 400 which supports a planar beam splitter 401. The beam splitter 401 is arranged on the support 400 so that its plane is at a 45 degree angle with respect to the incoming beam. A photodiode 402 is mounted on the surface of the base below the beam splitter 401. The beam splitter 401 directs a small portion (e.g. 5%) of the output beam from the tunable filter 316 to the photodiode 402, which functions to sense the intensity level of the tunable laser output, so that the user may appropriately control the current to the laser to achieve the desired optical output level or intensity. The remainder of the output beam from the tunable filter is directed by a beam splitter to the isolator 501.

Downstream from the collimating lens 501 is a window 600 which is attached to the housing 200 and permits the collimated beam to exit the housing 200. Outside of the housing 200 and coupled to the collimated beam is the optical output interface, which includes a fiber focus alignment lens 700 and the optical fiber ferrule 800. In the embodiment depicted, the cladded optical fiber 802 is a "pig-tail" that extends for a relatively short distance (ranging from a meter to 20 meters) to allow coupling to other subassemblies. In another embodiment (not depicted), the window 600 or the alignment lens 700 may be the final downstream components associated with the housing 200, to allow the user to couple an optical fiber directly to the outside of the housing 200 through a pluggable connector or other optical interface.

A thermoelectric cooler includes first and second plates 702 and 704, respectively, separated by intermediate members 703a, 703b, 703c, etc., that provides a base for supporting the various elements of the tunable laser 100. In one embodiment, the thermoelectric cooler (comprised of elements 702, 703, 704) is positioned between the bottom 204 of the housing 200 and one or more of the laser components 300. The plates 702, 704 may be constructed from a variety of materials, including ceramics. The intermediate members 703a, 703b, etc., each include a first end operatively connected to the first plate 702 and a second end operatively connected to the second plate 704. The intermediate members 703a, 703b, etc. are electrically connected in series by connectors. The intermediate members 703a, 703b, etc., are constructed from semiconductor material that allows for electron flow through the member 703a, 703b, etc. when connected to a DC power source. In use, as the DC power source is activated and a current passes through the series of intermediate members 703a, 703b, etc., the current causes a decrease in temperature at the first plate 702 that absorbs heat from the laser components 300. The heat is transferred through the plate 702 and intermediate members 703a, 703b, etc., into the second plate 704. This heat may then be transferred from the second plate 704, such as to a heat sink.

Likewise, the temperature of the tunable filter 316 and cavity length actuator 317 may be separately controlled from the other laser components 300. A bench 318, which may be composed of a glass, may provide thermal isolation from the thermoelectric cooler 400.

One example of a tunable laser is disclosed in U.S. Pat. No. 7,257,142, herein incorporated by reference. Such patent describes what may be called an "integrated design" contrast with an arrangement of discrete components such as described in the present disclosure.

An additional lens 323 may be positioned in front of the collimating lens 321. This lens 323 may be relatively "weak" and relaxes tight placement tolerances of the pair of lens 321. The lateral alignment of the lens 323 is done actively to correct for placement errors and attachments shifts of the lenses 321. In one embodiment, the lateral alignment is done using modulator monitor photodiode current as a feedback signal.

The embodiment of the components 300 of FIG. 3 also includes a tunable filter 316 with a pair of spaced apart tunable etalons 316a, 316b. The etalons 316a, 316b are Fabry-Perot spaced etalons that are positioned in a parallel configuration. The first etalon 316a includes a thickness measured between opposing faces and a refractive index according to the material from which it is constructed. The second etalon 316b includes a thickness measured between its opposing faces and a refractive index according to the material from which it is constructed. The etalons 316a, 316b may be constructed from the same or different materials, and may include the same or different thicknesses. Etalons 316a, 316b may be constructed from various materials, such as but not limited to silicon and gallium arsenide. One or both etalons 316a, 316b are tunable by a temperature-induced change in their refractive indexes and/or a temperature-induced change in their thickness. In one embodiment, the etalons 316a, 316b are tunable by simultaneous control of both the refractive index and the physical thickness.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

The invention claimed is:

1. A semiconductor gain device comprising of:
a substrate defining an upper surface;
an optical waveguide layer extending from a first end of the substrate to a second end of the substrate opposite to the first end, the optical waveguide layer including an active layer formed on the upper surface;
a reflective mirror provided at one end of the optical waveguide layer; and
an exit aperture on the other end of the optical waveguide layer for emitting optical energy;

wherein at least a portion of the optical waveguide layer is curved on the surface of the substrate with a radius of curvature of between 3.5 mm and 4 mm.

2. The device as defined in claim 1, wherein the distance from the first end to the second end is 2.0 mm or less.

3. The device as defined in claim 1, wherein the optical waveguide layer includes a first portion with zero curvature and a second portion with a radius of curvature of less than 4 mm.

4. The device as defined in claim 1, wherein the optical waveguide layer includes a first portion with zero curvature, a second portion adjacent to the first portion with an increasing radius of curvature, and a third portion adjacent to the second portion with a radius of curvature of less than 4 mm.

5. The device as defined in claim 4, wherein the optical waveguide layer includes a fourth portion adjacent to the third portion with a decreasing radius of curvature.

6. The device as defined in claim 4, wherein the first portion of the optical waveguide layer is 0.4 mm or less in length.

7. The device as defined in claim 4, wherein the third portion of the optical waveguide layer is at least 0.2 mm or more in length.

8. The device as defined in claim 4, wherein the second portion of the optical waveguide layer is at least 0.2 mm or more in length.

9. The device as defined in claim 5, wherein the fourth portion of the optical waveguide layer is at least 0.2 mm or more in length.

10. A semiconductor gain device comprising of:
a substrate defining an upper surface;
an optical waveguide layer extending from a first end of the substrate to a second end of the substrate opposite to the first end, the optical waveguide layer including an active layer formed on the upper surface;
a reflective mirror provided at one end of the optical waveguide layer; and
an exit aperture on the other end of the optical waveguide layer for emitting optical energy;
wherein the optical waveguide layer comprises a first portion adjacent to the reflective mirror with zero curvature, a second portion adjacent to the first portion with a radius of curvature that increases from zero to a predetermined value, and a third portion adjacent to the second portion with a constant radius of curvature equal to the predetermined value so that only single mode laser radiation is propagated through the exit aperture.

11. The device as defined in claim 10, wherein at least a portion of the optical waveguide layer is curved on the upper surface of the substrate with a radius of curvature of less than 4 mm so that any multimode radiation in the waveguide leaks from the curved portion and is not propagated through the exit aperture.

12. The device as defined in claim 10, wherein the distance from the first end to the second end is 2.0 mm or less, and the the third portion defines a radius of curvature of less than 4 mm.

13. The device as defined in claim 10, wherein the predetermined value is less than 4 mm.

14. The device as defined in claim 10, wherein the optical waveguide layer further includes a fourth portion adjacent to the third portion with an decreasing radius of curvature that decreases from the predetermined value to zero curvature.

15. The device as defined in claim 14, wherein the first portion of the optical waveguide layer is 0.4 mm or less in length; the second portion of the optical waveguide layer is at least 0.2 mm or more in length; the third portion is at least 0.2 mm or more in length; and the fourth portion is at least 0.2 mm or more in length.

16. The device as defined in claim 10, wherein the predetermined value is between 3.5 mm and 4.0 mm.

17. A semiconductor gain device comprising of:
a substrate defining an upper surface and extending from a first end to a second end; and
an optical waveguide layer having a width of 3 microns and including an active layer formed on the upper surface;
a reflective mirror provided at one end of the optical waveguide layer; and
an exit aperture on the other end of the optical waveguide layer for emitting optical energy;
wherein at least a portion of the optical waveguide layer is curved on the upper surface of the substrate with a radius of curvature of greater than 3.5 and less than 4 mm so that only single mode laser radiation is propagated through the exit aperture.

18. The device as defined in claim 17, wherein the distance from the first end to the second end is 2.0 mm or less, and the optical waveguide layer includes a first portion adjacent to the reflective mirror with zero curvature, and a second portion adjacent to the first portion with a radius of curvature of less than 4 mm.

19. The device as defined in claim 17, wherein the distance from the first end to the second end is 1.0 mm.

20. The device as defined in claim 17, wherein the optical waveguide layer includes a portion with a radius of curvature of 3.8 mm.

* * * * *